United States Patent [19]

Congdon

[11] Patent Number: 4,523,154
[45] Date of Patent: Jun. 11, 1985

[54] ENHANCED-ACCURACY SEMICONDUCTOR POWER AMPLIFIER

[75] Inventor: James S. Congdon, Maynard, Mass.

[73] Assignee: GenRad, Inc., Concord, Mass.

[21] Appl. No.: 495,670

[22] Filed: May 18, 1983

[51] Int. Cl.[3] ............................................. H03F 3/04
[52] U.S. Cl. ..................................... 330/266; 330/289
[58] Field of Search ................. 330/263, 266, 289, 297

[56] References Cited

U.S. PATENT DOCUMENTS 4,424,493 1/1984 Schroeder .......................... 330/263

FOREIGN PATENT DOCUMENTS 55-35520 3/1980 Japan .

Primary Examiner—James B. Mullins
Assistant Examiner—G. Wan
Attorney, Agent, or Firm—Cesari and McKenna

[57] ABSTRACT

A DC amplifier uses complementary npn and pnp output transistors on n-type and p-type substrates, respectively. The output transistors are in an emitter-follower configuration with no emitter resistor to prevent thermal runaway. Instead, emitter-follower driver-stage transistors are provided on the same substrates as the output transistors to force a reduction in the bias voltage on the output stage when the temperature of an output transistor increases. This circuit prevents thermal runaway and temperature-dependent offsets without emitter resistors, which would increase output impedance, and without feedback from the output stage to the input stage, which would slow the response of the amplifier. Additionally, compensation-network transistors are provided to eliminate offsets resulting from driver- and output-transistor base-to-emitter voltage differences caused not only by temperature differences between the transistors on different substrates but also by manufacturing variations. The compensation-network transistors, like the driver-stage transistors, are on the same substrates as the output transistors. They are connected to provide a compensation voltage that is equal to the difference between the base-to-emitter voltages of transistors on the two substrates. The compensation voltage is used to cancel offsets that would otherwise result from such differences.

3 Claims, 2 Drawing Figures

ENHANCED-ACCURACY SEMICONDUCTOR POWER AMPLIFIER

BACKGROUND OF THE INVENTION

1. Field of the Invention

This invention relates to a semiconductor amplifier. More specifically, it relates to a wide-band DC amplifier having a moderate power output and characterized by faithful reproduction of its input signals.

2. Prior Art

In many DC amplifier applications it is desirable to provide a moderate output power, e.g. 2 or 3 watts, together with a low output impedance. The latter characteristic is usually accomplished by means of negative feedback which, however, adversely affects the high-frequency or transient response of the amplifier. Specifically, with negative feedback the output of the amplifier is characterized by excessive delay or overshoot in response to sudden changes in the input voltage.

One might instead resort to an essentially open-loop amplifier configuration with an emitter-follower output stage which provides the desired low-impedance output characteristic. However, a conventional, i.e. push-pull, output stage is subject to thermal runaway and consequent burnout of one or both of the output transistors unless the amplifier includes provisions for preventing this from happening. For example, emitter resistors might be connected in series with the emitters of the output transistors, but this would increase the output impedance.

One solution to the thermal runaway problem has been to use a monolithic amplifier construction in which all of the transistors are formed on the same semiconductor chip. All of the transistors thus have essentially the same temperature. Accordingly, an increase in the temperature of one of the output transistors, which would otherwise increase the current through that transistor, will, by virtue of the temperature increase in other transistors in the circuit, cause an offsetting reduction in the bias voltage applied to the output transistors, thereby preventing an excessive increase in quiescent current and, consequently, eliminating runaway.

However, the latter circuit is characterized by temperature-dependent offsets in the output voltage. Moreover, the output current capability is not as high as desirable for a power amplifier because, in a complementary monolithic amplifier, transistors of one type, npn or more likely pnp, have inherently high collector resistances or other deficiencies. Therefore, inverse feedback is still required for operation of the amplifier.

SUMMARY OF THE INVENTION

I have overcome the foregoing problems by using a "bilithic" construction in which the npn transistors are formed on one chip and the pnp transistors are formed on another chip. On each chip the collectors of the transistors are part of the common substrate, and this provides a desirably low intrinsic collector resistance. The output and driver stages of the amplifier are connected in a conventional emitter-follower arrangement, with an npn driver transistor driving the pnp output transistor and an pnp driver transistor driving an npn output transistor. With this arrangement, if the temperature of one of the output transistors increases, with a corresponding increase in the other transistors of the same type, there will be a decrease in the base-emitter diode drop of the driver transistor of the same type. This will decrease the bias voltage applied between the bases of the output-stage transistors, thereby tending to decrease the currents in the output transistors and thus preventing thermal runaway.

The amplifier as thus far described is subject to a temperature dependent offset of the output voltage because of the difference between the diode drops in the pnp and npn driver and output transistors. I have provided further circuitry to substantially eliminate this offset. Specifically, the amplifier includes a further pnp-npn transistor pair, formed on the same chips as the output and driver transistors and connected so that their base-emitter diode drops are subtracted from each other. The resulting difference voltage is inverted and passed through the amplifier to cancel the offset.

The amplifier thus exhibits a low output impedance and is protected against thermal runaway, both without the use of multiple-stage negative feedback. Moreover, it is capable of providing a substantial output power.

BRIEF DESCRIPTION OF THE DRAWINGS

These and further features and advantages of the present invention are described in connection with the accompanying drawings, in which.

DETAILED DESCRIPTION OF THE PREFERRED EMBODIMENT

Figure 1:
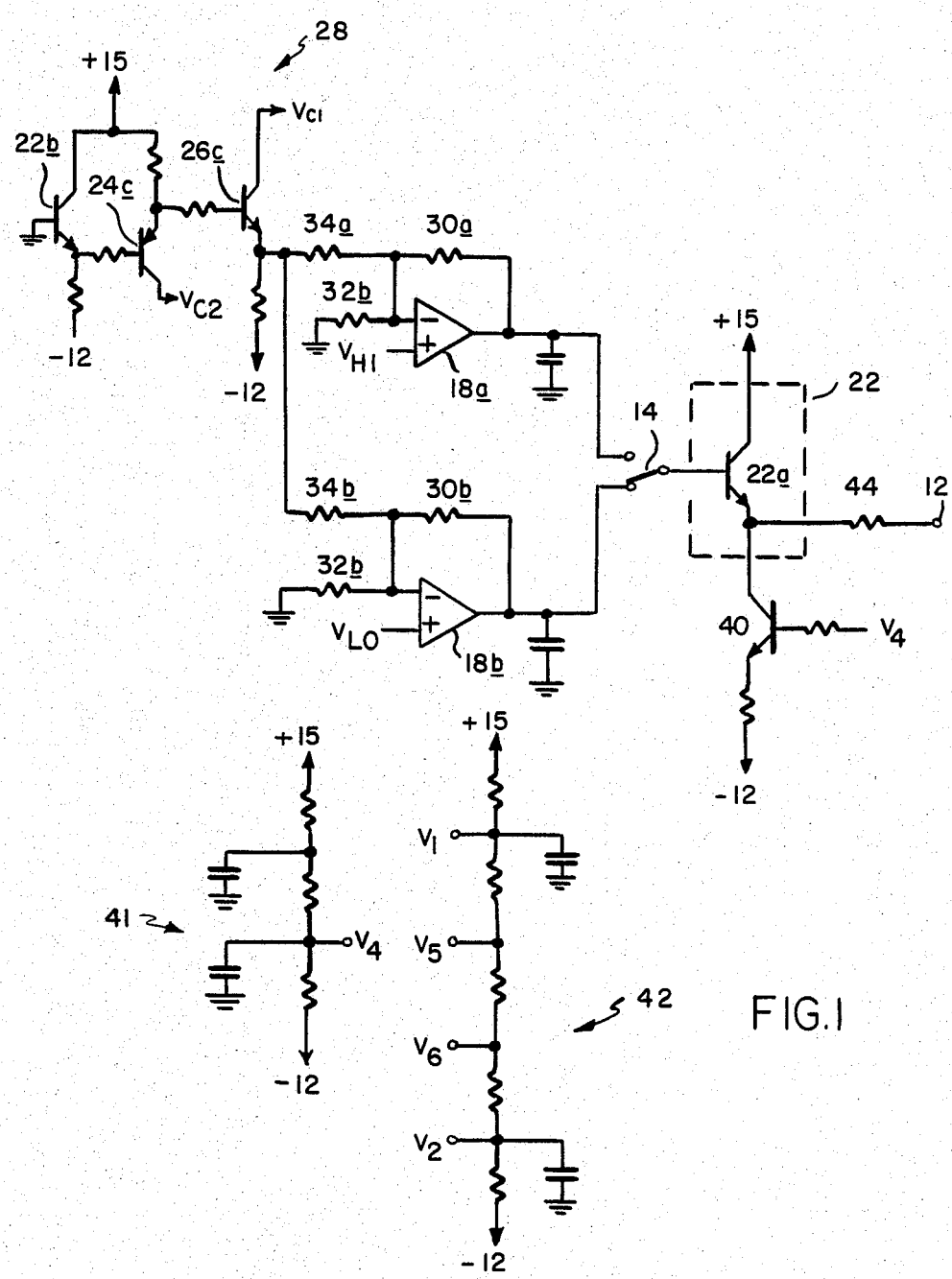
FIG. 1 is a schematic diagram of the input and intermediate stages of one embodiment of the present invention together with compensation and voltage-divider networks.
Figure 2:
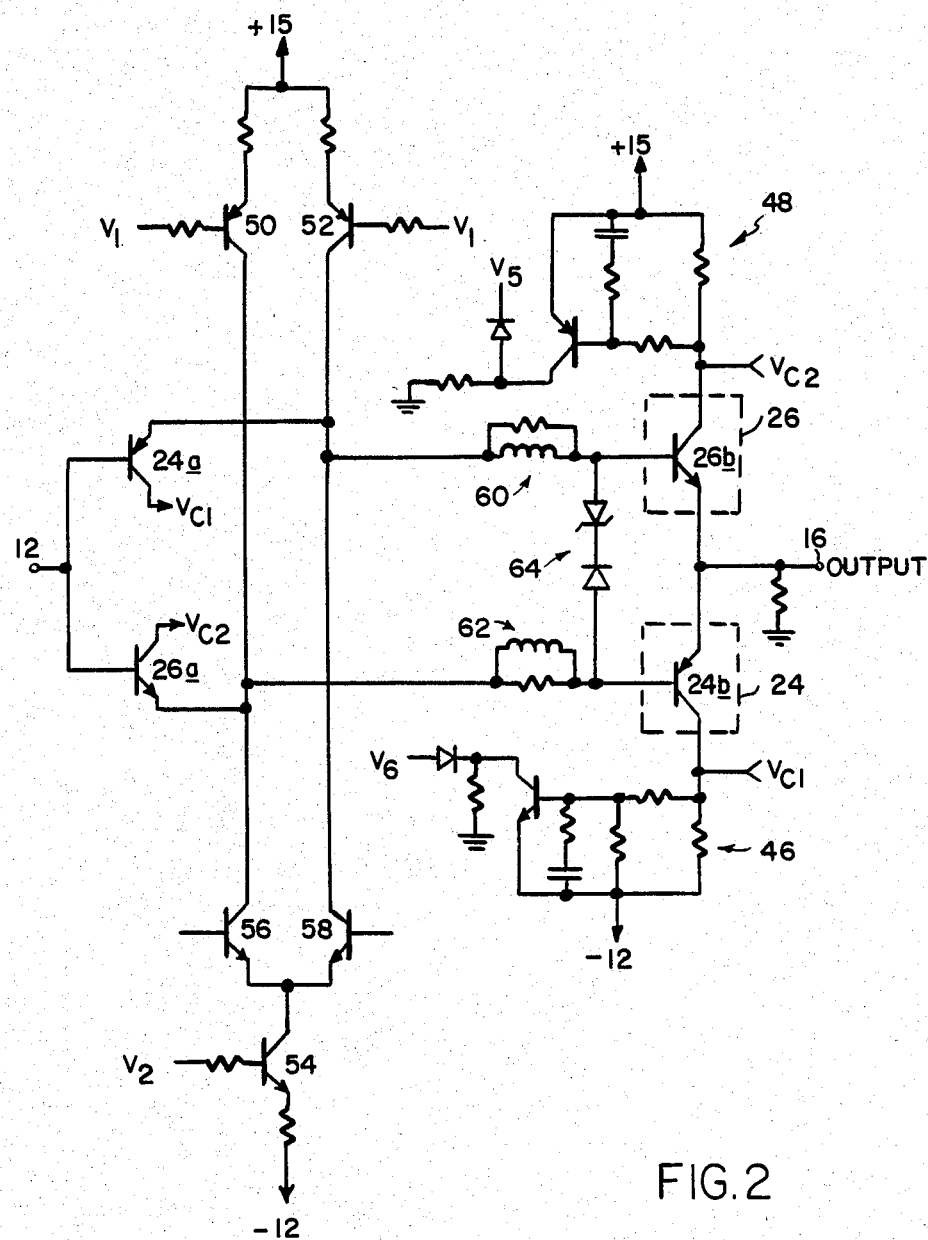
FIG. 2 is a schematic diagram of the driver and output stages of the same embodiment.

FIGS. 1 and 2 together constitute a schematic diagram that depicts a DC amplifier in which the circuitry depicted in FIG. 1 is connected to that of FIG. 2 at node 12 in FIGS. 1 and 2. The input node of the amplifier is at a switch 14, while the output node is indicated by reference number 16.

The switch 14 switches rapidly between high and low reference voltages generated by operational amplifiers 18a and 18b. It feeds the selected voltage to a transistor 22a formed on a substrate 22 and connected in an emitter-follower configuration. The output of this stage is applied to the bases of two transistors 24a and 26a in a driver stage. These transistors are also in an emitter-follower configuration. The output voltages of the driver transistors are applied to the bases of transistors 24b and 26b, which together belong to the output stage. They are connected in an emitter-follower arrangement with their emitters connected together at the output node 16 of the amplifier. Although output transistor 24b is depicted as a single transistor, it preferably comprises multiple transistors in parallel, as does output transistor 26b.

The emitter-follower configuration of the output stage provides a low output impedance. Further to provide a low output impedance, the emitter resistor commonly used to prevent thermal runaway is omitted. Moreover, the output current capability of the amplifier is high because the npn transistor 24b and pnp transistor 26b are fabricated on different multiple-transistor chips 24 and 26, respectively; the npn transistor is fabricated on a substrate of n-type material, and the pnp transistor is fabricated on a substrate of p-type material. This allows the collector of each transistor to be part of its respective low-resistance substrate, so the output current capability will be high.

To prevent thermal runaway, the amplifier employs the thermal responses of transistors 24a and 26a in its driver stage instead of emitter resistors. As will be described in more detail below, driver transistors 24a and 26a are on the same chips as output transistors 24b and 26b, respectively, so the temperature of a given driver transistor is substantially the same as that of the output transistor on the same substrate. The same temperature increase that, without compensation, would tend to increase the current through, say, output transistor 24b also decreases the diode drop in transistor 24a on the same chip, and the circuit configuration is such that the reduced diode drop reduces the differential voltage applied to the output transistors 24a and 26b and thus counteracts the tendency toward increased current.

With the foregoing arrangement, there will be a temperature-dependent offset in the output of the amplifier, and in many applications it will be desirable to eliminate this offset. As will be described in more detail below, further transistors 22b, 24c, and 26c, which are on substrates 22, 24, and 26, respectively, are connected in a compensation network 28 that presents a compensating, temperature-dependent input to the operational amplifier 18. This compensating input is forwarded to the amplifier output terminal 16, where it essentially eliminates the offsets that would otherwise result from the diode drops in the amplifier transistors of the intermediate, driver, and output stages.

We now turn to a more detailed description of the amplifier. The reference voltages between which the switch 14 alternates originate in voltage levels $V_{HI}$ and $V_{LO}$ at the non-inverting input terminals of operational amplifiers 18a and 18b, respectively. The output of, say, operational amplifier 18a is fed back to its inverting input terminal through a resistor 30a. The current flowing through resistor 30a is divided between further resistors 32a and 34a. Resistor 32a leads to ground, and resistor 34a leads to the emitter of transistor 26c, whose voltage differs from ground potential by approximately one diode drop, as will be discussed below. If the resistance of resistors 30a and 34a is 100 kilohms, for example, while that of resistor 32b is 250 kilohms, a closed-loop gain of 2.4 from the non-inverting terminal of amplifier 18a to its output node results. The output voltage of operational amplifier 18a is thus $2.4 \times V_{HI}$ plus the absolute value of the negative voltage at the emitter of transistor 24b.

The circuitry to the left of the switch 14 deals in general with slowly changing voltages. However, the switch 14 is a high-speed electronic device that switches between the two reference voltages applied to it at rates that can be on the order of 100 MHz. Thus, the circuitry to the right of the switch deals with high-frequency signals and so includes no feedback loops that degrade the pulse transmission accuracy. Transistor 22a is biased by a current sink including transistor 40. Bias voltage $V_4$ for transistor 40, as well as other bias voltages in the amplifier, is provided by a voltage-divider networks 41 and network 42. Since transistor 22a is in an emitter-follower configuration, it passes the signal with unity voltage gain—but with an offset equal to its base-to-emitter voltage—to the bases of complementary driver transistors 24a and 26a. As was mentioned before, this signal is forwarded with unity gain by the driver and output transistors to the output node 16.

A common bias network biases the driver and output transistors. Transistors 24a and 24b are on the same substrate and have collectors in common. This is indicated by the common notation Vc1 for their collector voltage. The collectors of these transistors are connected to an overload-protection circuit 46. The collectors of transistors 26a and 26b are similarly connected to an overload-protection circuit 48, as is indicated by the notation Vc2. The bias circuit includes current sources comprising transistors 50 and 52, a current sink comprising transistor 54, and switches consisting of transistors 56 and 58.

When the amplifier is being used to drive a load, transistor 58 is turned off by a signal at its base to act as an open switch, while transistor 56 is turned on to act as a closed switch. Transistors 50 and 52 are biased to provide, for example, 10 milliamperes apiece, and the current from transistor 52 is divided between the emitter of transistor 24a and the base of transistor 26b. Transistor 54 operates as a current sink that draws 20 milliamperes, so the emitter of transistor 26a and the base of transistor 24b together add 10 milliamperes to the 10 milliamperes flowing from the collector of transistor 50.

The circuit of FIG. 2 can be analyzed as complementary successive stages of emitter-follower amplifiers because the current sources and sink comprising transistors 50, 52, and 54 exhibit high small-signal impedances, while roll-off networks 60 and 62, which connect the emitters of the driver transistors to the bases of the output transistors, present negligible impedance at low frequencies.

Although not necessary for an understanding of the present invention, a zener-diode circuit 64 is also depicted in FIG. 2. With switch transistor 56 on and switch transistor 58 off, the zener-diode circuit does not conduct current, so it does not contribute to the functioning of the amplifier. However, when the states of switch transistors 56 and 58 are reversed, current from the voltage source that includes transistor 50 flows from the collector of transistor 50 through the zener circuit 64 to the collector of transistor 58 and thereby back biases the output transistors 24b and 26b so that the amplifier, which is used in testing other circuits, can present a high impedance at the output node 16.

A review of the signal path from the switch 14 to the output node 16 reveals that, without the operation of the compensation network 28, the output of the amplifier would be offset from the desired value by a quantity equal to the diode drop of intermediate amplifier transistor 22a and the difference between the diode drops of transistors 24a and 26b. In this analysis, the upper branch in FIG. 2 will be considered, but it will be apparent that the same results are obtained if the lower branch, which includes transistors 26a and 24b, is analyzed.

Specifically, we proceed from left to right through the circuit and note that the diode drop of transistor 22a is subtracted from the input voltage. The diode drop of transistor 24a is added to the resultant voltage, and the diode drop of transistor 26b is subtracted from that value.

The compensation network 28 eliminates the offset by combining the diode drops of transistors 22b, 24c, and 26c and subtracting the resultant voltage from the reference voltages from which the switch 14 produces the input signal. The diode drops of transistors 22b, 24c, and 26c are essentially the same as the diode drops in transistors 22a, 24a, and 26b because they are on the same substrates and thus are at the same temperatures. Their combination thus cancels the offset contributed by transistors 22a, 24a, and 26b.

Specifically, in the compensation network 28, ground potential is applied to the base of transistor 22b, so the voltage at the emitter of transistor 22b is below ground potential by the base-to-emitter voltage of the intermediate-stage amplifier transistor 22a. This voltage is applied to the base of transistor 24c through a small resistance included for radio-frequency stability. The emitter voltage of transistor 24c is above that of transistor 22b by the base-to-emitter voltage of driver transistor 24a. This voltage in turn is applied through another small resistance to the base of transistor 26c, whose emitter voltage differs from its base voltage by the base-to-emitter voltage of output transistor 26b. The emitter voltage of transistor 26c is the output of the compensation network 28.

Since resistors 34a and 34b have the same value as resistors 30a and 30b, the negative emitter-ground voltage of transistor 26c is subtracted with unity gain from the voltages resulting from amplification of $V_{HI}$ and $V_{LO}$. The compensation-network output thus is inverted and forwarded with unity gain to the output node 16. The offsets of the several stages of the amplifier are therefore cancelled out by subtracting a signal generated from transistors on the same substrates as those causing the offsets. This is accomplished without the use of a multiple-stage feedback loop, which would degrade the response of the amplifier.

We now turn to the manner in which the amplifier prevents thermal runaway. With constant reference voltages, the voltage at the output node 16 for a given state of the switch 14 should remain constant. However, a temperature increase in an output transistor 24b or 26b increases its collector current for a given base voltage. The driver stage, which has a low output impedance, controls the voltages at the bases of the output-stage transistors. Thus, without compensation, the base voltage would be held constant by the driver stage and therefore the temperature increase would result in increased base current and thus increased collector current. Without compensation, there would thus be increased power dissipation, further temperature increases, and still further increase in current. In short, thermal runaway would occur if there were no compensation.

According to the present invention, however, the amplifier is configured so that a driver transistor 24a or 26a causes the potential difference between the bases of the output transistors 24b and 26b to decrease in response to an increase in the temperature of the output transistor on the same chip. This tends to counteract the current increase and thereby prevent thermal runaway.

More specifically, since transistors 24a and 24b are on the same substrate, their temperatures are almost exactly the same, and heat generated by dissipation in output transistor 24b raises the temperature of the entire chip—and, specifically, the temperature of the base-emitter junctions of transistors 24a and 24b. As a consequence, the base-to-emitter diode drop of driver transistor 24a decreases. This tends to counteract thermal runaway in output transistor 24b, as can readily be understood from the fact that driver transistors 24a and 26a force the sum of the base-to-emitter voltages of output transistors 24b and 26b to be equal to the sum of the base-to-emitter voltages of the driver transistors 24a and 26a.

If driver transistor 26a on the other substrate 26 remains at a constant temperature and thus maintains a substantially constant diode drop, the total potential difference between the emitters of the driver transistors is reduced, and so is that between the output-transistor bases. It can be shown that, for a given temperature, the product of the magnitudes of the collector currents in the output transistors 24b and 26b is decreased with a decreased potential difference between their bases, so thermal runaway is counteracted. Furthermore, an offset in the output, which would otherwise result from the change in the diode drop of driver transistor 24a, is compensated for by the action of the compensation network 28 as described above.

Accordingly, output transistor 26b, whose temperature has not changed, receives the same base voltage as it did before the temperature change in transistor 24b, but the base voltage at transistor 24b is raised to reduce its tendency for increased current flow.

Thermal runaway resulting from an increase in the temperature of output transistor 26b is similarly prevented by driver transistor 26a.

Accordingly, the present invention prevents thermal runaway and compensates for temperature-dependent offsets without the use of feedback loops, which would degrade the response of the amplifier, and without emitter resistors in the output stage, which would increase the output impedance of the amplifier. It also maintains a high output current capability by avoiding the high intrinsic collector resistances that occur in complementary monolithic amplifiers.

I claim:
1. A DC electronic amplifier comprising:
    A. a first semiconductor substrate of n-type semiconductor material;
    B. a second semiconductor substrate of p-type semiconductor material;
    C. first and second npn transistors formed on said n-type substrate;
    D. first and second pnp transistors formed on said p-type substrate; and
    E. amplifier circuit means interconnecting said first and second transistors of said n-type and p-type substrates as an amplifier in which said second npn and pnp transistors form an output stage in which their emitters are connected together in a complementary emitter-follower configuration for driving an amplifier load connected to said emitters, said first npn and pnp transistors being arranged in a previous stage with their bases connected together in a complementary emitter-follower stage, the emitter of each first transistor on a substrate being coupled to the base of the second transistor on the other substrate so that the sum of the base-to-emitter voltages of said first transistors is applied between the bases of said second transistors, whereby a temperature increase in a second transistor also occurs in the first transistor on the same substrate, reducing its diode drop and thus reducing the voltage impressed across the series combination of said base-emitter junctions of said second transistors, thermal runaway in a second transistor on a substrate thereby being counteracted by the action of the first transistor on the same substrate.

2. A DC electronic amplifier as recited in claim 1 further including:
    A. a third pnp transistor on said p-type substrate;
    B. a third npn transistor on said n-type substrate;

C. compensation circuit means configuring each third transistor with its base-emitter junction forward biased and applying the difference between the base-to-emitter voltages of said third transistors to said amplifier circuit means to subtract the difference voltage from the signals applied to the bases of said second transistors, whereby the difference voltage cancels the difference between the base-to-emitter voltages of the first and second transistors.

3. A transistor amplifier circuit comprising:

A. a unity-gain amplifier including one amplifier transistor or a series combination of more than one amplifier transistor formed on a semiconductor substrate associated therewith, each amplifier transistor being connected in an emitter-follower configuration to form a signal train in which signals appearing at the base of an amplifier transistor are reproduced at the emitter thereof with unity gain but with an offset equal to the base-to-emitter voltage of that amplifier transistor;

B. a subtraction circuit, including a reference transistor associated with each amplifier transistor and forward biased to have substantially the same base-to-emitter voltage as its associated amplifier transistor, each reference transistor being formed on the same substrate as its associated amplifier transistor so that its base-to-emitter voltage substantially tracks that of its associated amplifier transistor with changes in temperature, the subtraction circuit being connected to subtract from a voltage in the signal train of the unity-gain amplifier the base-to-emitter voltage of each reference transistor and thereby cancel the offset of each amplifier transistor.

* * * * *